(12) United States Patent
von Kaenel

(10) Patent No.: US 8,354,872 B2
(45) Date of Patent: Jan. 15, 2013

(54) CASCODE SWITCHING CIRCUIT

(75) Inventor: Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 81 days.

(21) Appl. No.: 13/078,616

(22) Filed: Apr. 1, 2011

(65) Prior Publication Data

US 2011/0175668 A1   Jul. 21, 2011

Related U.S. Application Data

(63) Continuation of application No. 12/478,249, filed on Jun. 4, 2009, now Pat. No. 7,940,110.

(51) Int. Cl.
*H03K 17/16* (2006.01)
(52) U.S. Cl. ......... 327/379; 327/180; 327/427; 326/116
(58) Field of Classification Search .................. 327/403, 327/404, 427–437, 180, 116, 124; 326/116
See application file for complete search history.

(56) References Cited

U.S. PATENT DOCUMENTS

| | | | |
|---|---|---|---|
| 6,605,977 B2 | 8/2003 | Martini | |
| 7,567,279 B2 * | 7/2009 | Yourlo et al. | 348/294 |
| 7,940,110 B2 * | 5/2011 | von Kaenel | 327/379 |
| 2008/0109587 A1 | 5/2008 | Greenhalgh et al. | |
| 2008/0224733 A1 | 9/2008 | Dale et al. | |

* cited by examiner

*Primary Examiner* — Lincoln Donovan
*Assistant Examiner* — Shikha Goyal
(74) *Attorney, Agent, or Firm* — Lawrence J. Merkel; Meyertons, Hood, Kivlin, Kowert & Goetzel, P.C.; Erik A. Heter

(57) ABSTRACT

A switch circuit is disclosed. The switch circuit may include one or more arrangements of transistors coupled in a cascode configuration. The transistors used to implement the switch circuit may be configured for operation within a first range of voltages. The application in which the switch circuit may be implemented may require conveying signals within a second range of voltages that is greater than the first range of voltages. Thus, the switch circuit may include one or more additional transistors to ensure that a voltage drop between any two terminals of the transistors used in the switch circuit is within the first range of voltages.

15 Claims, 4 Drawing Sheets

CASCODE SWITCHING CIRCUIT

This application is a continuation of U.S. application Ser. No. 12/478,249, filed Jun. 4, 2009 now U.S. Pat. No. 7,940,110.

BACKGROUND

1. Field of the Invention

This invention relates to electronic circuits, and more particularly, to switching circuits used in an interface.

2. Description of the Related Art

Switching circuits are well known in the electronic arts, and may be utilized in a wide variety of applications. These applications may include various types of analog and digital circuits. Some switching circuits may be used to select a signal from one of a number of different sources while other switching circuits may be used for gating a signal such that is may be conveyed from one location to another.

Various types of switching circuits may include one or more transistors. The signals used to activate these transistors may be within a pre-defined range of operating voltages. Similarly, the signals that are switched by operation of the transistors of a switching circuit may also vary within a pre-defined range of operating voltages. As technology has advanced, the size of transistors used in many switching circuits has decreased. Moreover, the operating voltages of many circuits in which switching circuits have also decreased.

SUMMARY

A switch circuit is disclosed. In various embodiments, the switch circuit may include one or more signal paths each including at least two transistors coupled in a cascode configuration. The transistors used to implement the switch circuit may be configured for operation within a first range of voltages. The application in which the switch circuit may be implemented may utilize signals that have a voltage swing (e.g., difference between logic high and logic low voltages) that is greater than the first range of voltages. Thus, the switch circuit may include one or more additional transistors to ensure that a voltage drop between any two terminals of the transistors used in the switch circuit is within the first range of voltages.

In one embodiment, a switch circuit includes a first transistor and a second transistor coupled in a cascode configuration between a first data node and a second data node. The transistors may be rated for operation within a first voltage range (e.g., 0-1.8 volts), while a maximum voltage difference between a first and second data nodes of the circuit may be within a second voltage range. The first transistor may be coupled to receive, on its gate terminal, a nominally fixed voltage during operation. The switch may be activated by the assertion of an enable signal on a gate terminal of the second transistor. A third transistor may be coupled to provide a source-drain path between the gate terminal of the first transistor and an intermediate node to which both the first and second transistors are coupled. The third transistor may become active responsive to a de-assertion of the enable signal. Activation of the third transistor may pull the intermediate node toward the nominally fixed voltage, and may thus ensure that a voltage drop between any two transistors of the switch circuit is within the first range of voltages.

BRIEF DESCRIPTION OF THE DRAWINGS

The following detailed description makes reference to the accompanying drawings, which are now briefly described.

Figure 1:
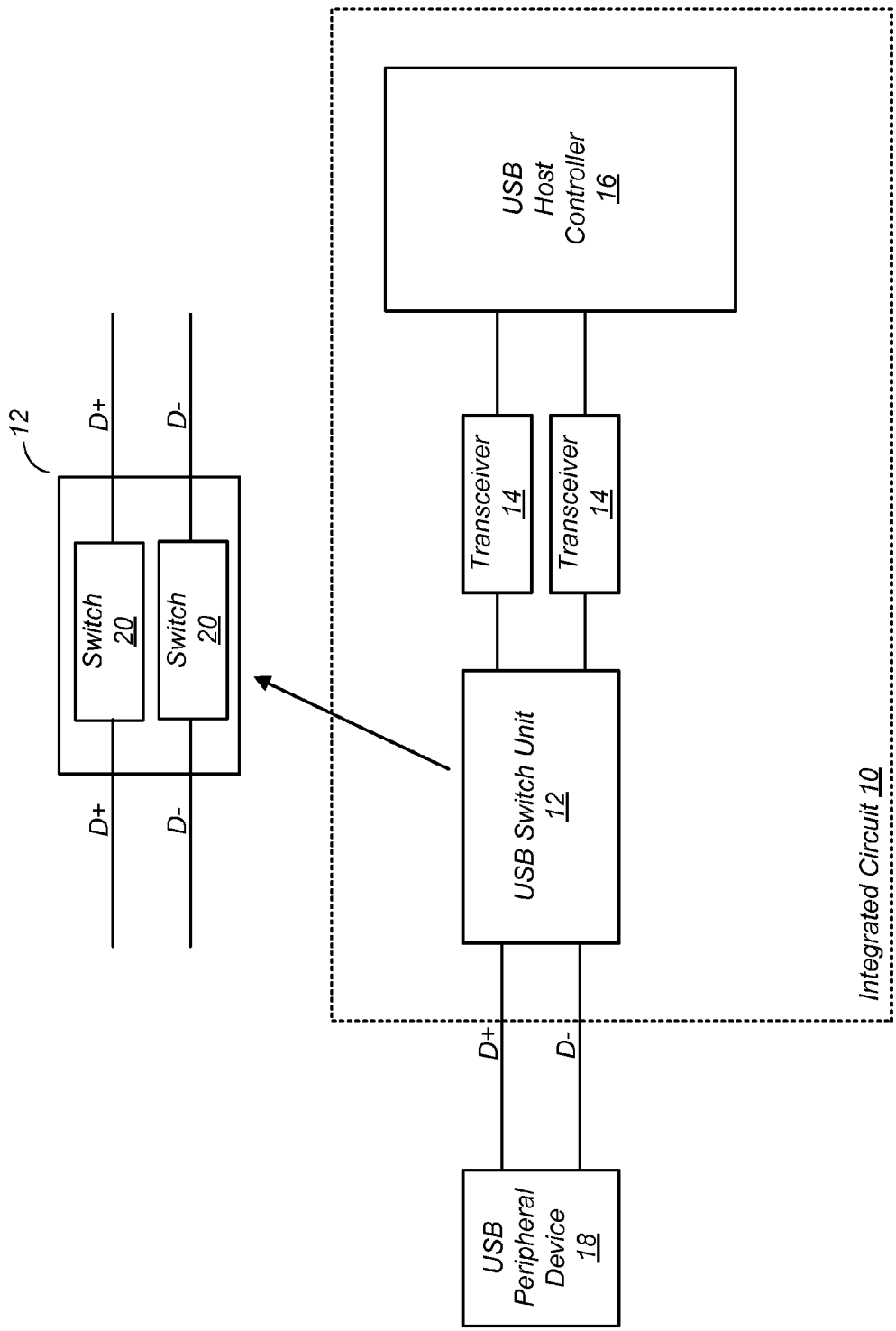
FIG. 1 is a block diagram of one embodiment of an integrated circuit having a serial bus interface.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) having a serial bus interface is shown. In the embodiment shown, IC 10 includes a Universal Serial Bus (USB) interface (i.e. USB port) that includes USB switch unit 12, transceivers 14, and USB host controller 16. A USB peripheral device 18 is coupled to IC 10 via a differential signal path that includes the true (D+) and complementary (D−) data lines of the bus.

IC 10 may be one of a number of different types of IC's, and thus may include various other functional units that are not explicitly shown here. In one embodiment, IC 10 may include one or more processors having one or more execution cores, various levels of cache memory, and so forth. IC 10 may also be a system on a chip (SOIC) in some embodiments, including processors, one or more peripherals, one or more memory controllers, etc. In another embodiment, IC 10 may be part of a computer system chipset, and thus may include the USB interface as well as a number of other bus interfaces (e.g., PCI/PCI-X, Firewire, GPIB, and so forth). Furthermore, various embodiments of IC 10 may be implemented in USB peripherals (e.g., printers, cameras, etc.) and portable devices (e.g., portable music players, phones, personal digital assistants, etc.). In general, IC 10 may be any type of IC in which the switch circuit to be discussed below may be implemented. It is noted that the use of USB in the embodiment of FIG. 1 is exemplary. The use of other types of buses in conjunction with the switch circuit to be discussed below, both serial and parallel, is possible and contemplated.

In the embodiment shown, USB host controller 16 is configured to provide host functionality used in controlling communications over a USB. The functions provided by USB host controller 16 may include recognition of the connection of a peripheral device (e.g., USB peripheral device 18) to the USB, establishing communications between host controller 16 and peripheral device 18, and controlling communications between other devices and/or functional units and USB peripheral device 18. USB host controller 16 may also be configured to perform these functions for a number of different USB links in addition to the one that is explicitly illustrated in FIG. 1.

In the embodiment shown, USB host controller 16 is coupled to a pair of transceivers 14. Each transceiver 14 may include a driver configured to drive signals through USB switch unit 12, and a receiver coupled to receive signals from USB switch unit 12. USB switch unit 12 may include switches corresponding to each of differential signal lines D+ and D−, each of which may allow signals to be conveyed to or from the USB peripheral device when activated. The transfer of signals between USB peripheral device 18 and USB host controller 16 may be prevented when the switches of USB switch unit 12 are deactivated.

Figure 2:
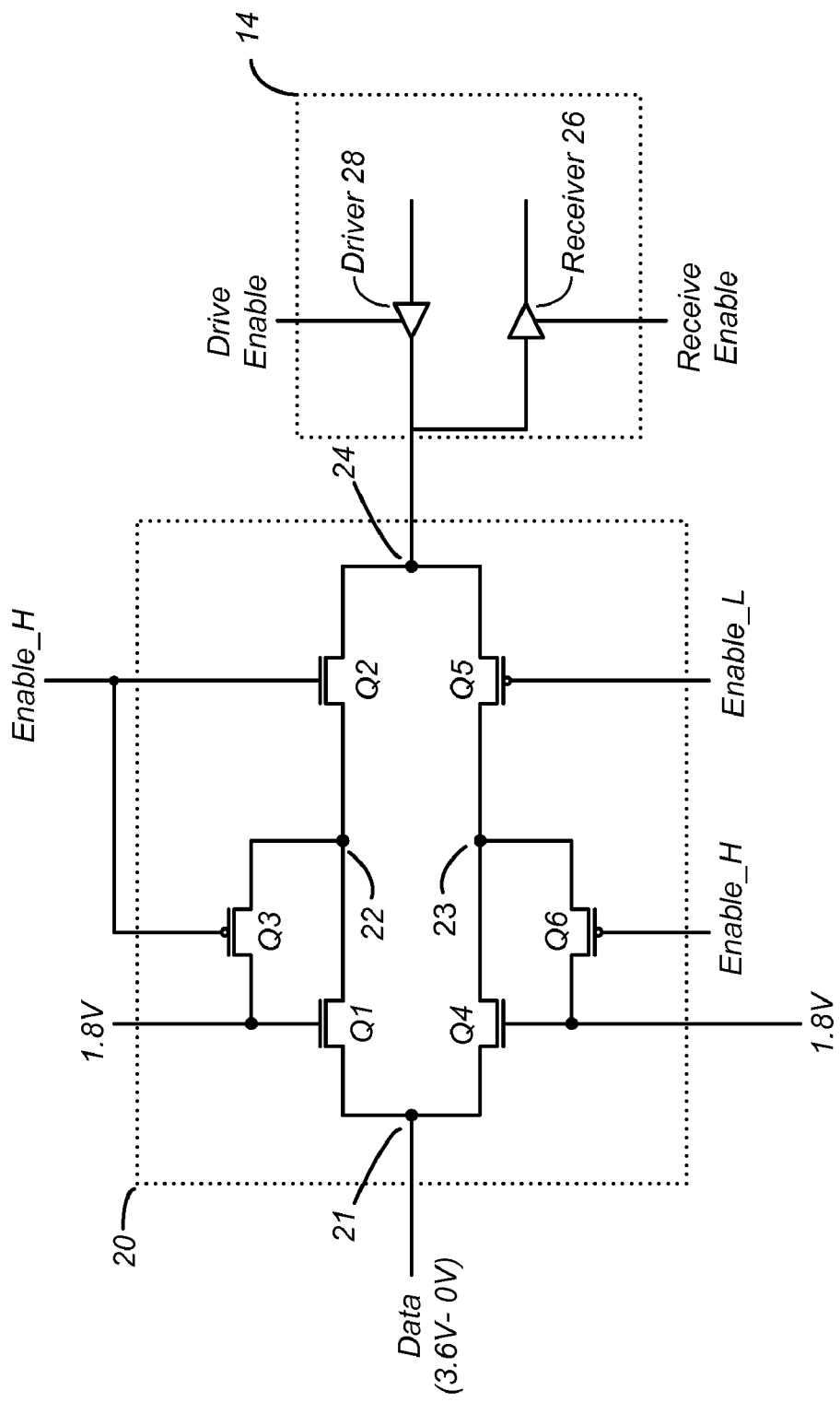
FIG. 2 is a schematic diagram of one embodiment of a switch circuit.

Turning now to FIG. 2, a schematic diagram of one embodiment of a switch circuit is shown. In the embodiment shown, switch circuit 20 may be one of one or more switch circuits that may be implemented in USB switch unit 12 of FIG. 1. Moreover, switch circuit 20 may be utilized in any implementation where it may provide a suitable switching function.

In the embodiment shown, switch circuit 20 includes two signal paths each including a pair of transistors coupled in a cascode configuration. In this particular embodiment, a signal path of switch circuit 21 includes transistors Q1 and Q2 coupled in a cascode configuration. NMOS transistor Q1 in this embodiment includes a source-drain path coupled between a first data node 21 and a first intermediate node 22. When operating, a gate terminal of transistor Q1 may be coupled to receive a nominally fixed voltage (1.8 V in this particular example, although other voltages are possible and contemplated). The nominally fixed voltage may vary somewhat during operation, due to switching noise, power transients, and so forth, although generally it is intended that this voltage remain relatively constant (e.g., 1.8 volts±5%).

A second NMOS transistor Q2 in the embodiment shown includes a source-drain path coupled between the first intermediate node 22 and a second data node 24. A gate terminal of transistor Q2 may be coupled to receive a true value of an enable signal, Enable_H. When the enable signal is asserted (high) in this embodiment, a first signal path may be provided between first data node 21 and second data node 24 through the source-drain paths of cascode-coupled transistors Q1 and Q2.

In the example shown in FIG. 2, the second data node of switch circuit 20 is coupled to an exemplary transceiver 14, which includes a driver 28 and a receiver 26, each of which may be coupled to receive respective enable signals. A functional unit to which each transceiver 14 may be coupled (e.g., USB host controller 16 of FIG. 1) may be configured such that only one of the drive enable and receive enable signals is asserted at a given time. Driver 28 may be configured to drive a signal onto second data node 24 when the driven enable signal is asserted. Similarly, receiver 26 may be configured to receive a signal from second data node 24 when the receive enable signal is asserted, and drive the received signal to another circuit responsive thereto.

In the embodiment shown, switch circuit 20 includes a second pair of cascode-coupled transistors which provide a signal path that is parallel with respect to the first signal path provided through transistors Q1 and Q2. More particularly, the embodiment shown includes a third NMOS transistor Q4, which includes a source-drain path coupled between the first data node 21 and a second intermediate node 23. When operating, transistor Q4 may be coupled to receive the same nominally fixed voltage on its gate terminal that may also be received by transistor Q1.

A first PMOS transistor Q5 is also included in the second signal path in this embodiment, having a source-drain path coupled between the second intermediate node 23 and the second data node 24. A gate terminal of transistor Q5 may be coupled to receive a complement, Enable_L, of the enable signal noted above. When the enable signal is asserted (and thus Enable_L is low), transistor Q5 may activate and thus provide a second signal path between first data node 21 and second data node 24.

In the absence of transistors Q3 and Q6 as shown in the embodiment of FIG. 2, the voltage difference that may exist between the first data node 21 and the second data node 24 may exceed the rated operating voltages (e.g., the maximum allowable voltage difference between any two terminals) for the other transistors of the circuit. Consider an example wherein the voltage signal swing on each of data nodes 21 and 24 may be 3.6 volts (e.g., a logic high is 3.6 volts, a logic low is 0 volts), in a switch circuit that differs from switch circuit 20 in that transistors Q3 and Q6 are note included. Consider further that each of the transistors of such a switch circuit may have a rated operating voltage of 1.8 volts, with each of the transistors having a threshold voltage of 0.3 volts. In such an example, a voltage difference of 3.6 volts may exist between data nodes 21 and 24 when the switch circuit is deactivated (e.g., when transistors Q2 and Q5 are turned off). However, since this particular example stipulates a threshold voltage of 0.3 volts for each of the transistors of the circuit, intermediate nodes 22 and 23 may charge up to 1.5 volts (since the gate terminals of Q1 and Q4 receive 1.8 volts) when switch circuit 20 is inactive. That is, nodes 22 and 23 may only charge to a threshold voltage below the gate voltage of transistors Q1 and Q4, after which Q1 and Q4 may stop actively conducting current.

Accordingly, if first data node 21 is at a voltage of 3.6 volts and Q2 is inactive because Enable_H is asserted, a voltage difference of 2.1 volts may exist between the source and drain terminals of each of transistors Q1 and Q4 (i.e. 3.6 volts−1.5 volts=2.1 volts). This 2.1 volt difference exceeds the rated operating voltage of 1.8 volts for the transistors considered in this example. Such a voltage excess may cause damage to transistors Q1 and Q4 and may even render them (and thus the switch circuit lacking transistors Q3 and Q6) inoperative. However, switch circuit 20 in the embodiment shown includes a pair of protection devices, transistors Q3 and Q6, that may minimize or eliminate the voltage excess.

Transistor Q3 in the embodiment shown is a PMOS transistor that includes a source-drain path coupled between intermediate node 22 and the nominally fixed voltage at the gate terminal of transistor Q1. Similarly, transistor Q6 in the embodiment shown is also a PMOS transistor having a source-drain path coupled between intermediate node 23 and the nominally fixed voltage at the gate terminal of transistor Q4. Transistors Q3 and Q6 in the embodiment shown are each coupled to receive the Enable_H signal on their respective gate terminals. Since these transistors are PMOS devices in this embodiment, they are thus configured to activate when the enable signal is de-asserted (e.g., at a logic low, or 0 volts). Accordingly, for the embodiment of switch circuit 20 illustrated in FIG. 2, transistors Q3 and Q6 will be active when transistors Q2 and Q5 are inactive (i.e. when the signal path between data nodes 21 and 24 is blocked). When active, transistors Q3 and Q6 of this embodiment will pull intermediate nodes 22 and 23, respectively, toward the nominally fixed voltage present on the gate terminals of Q1 and Q4 (e.g., 1.8 volts in the illustrated embodiment of switch circuit 20). Thus, the excessive voltage across the source-drain path of transistors Q1 and Q4 may be prevented when switch circuit 20 is inactive.

Generally speaking, various embodiments of switch circuit 20 as disclosed herein may include at least one signal path having a pair of transistors coupled in a cascode configuration, wherein one of the transistors is coupled to receive (on its respective gate terminal) an enable signal, while the other one of the transistors may included a gate terminal coupled to receive a nominally fixed voltage. Various embodiments of switch circuit 20 as disclosed herein may also include a protection device coupled to provide a signal path between the nominally fixed voltage and an intermediate node of the cascode configuration that may ensure that a voltage difference between any two terminals of a transistor in the circuit does not exceed its rated voltage when switch circuit 20 is turned off. A second signal path including a second pair of transistors coupled in a cascode configuration, along with the corresponding protection device, may also be included in various embodiments of switch circuit 20.

It should be noted that the types of transistors, the various voltage levels, and the logic signal assertion levels discussed above are exemplary, and thus are not limiting. Numerous variations utilizing different types of transistors (e.g., PMOS instead of NMOS and vice versa), different voltage levels, different operating voltage ranges, and different logic levels are possible and contemplated.

Figure 3:
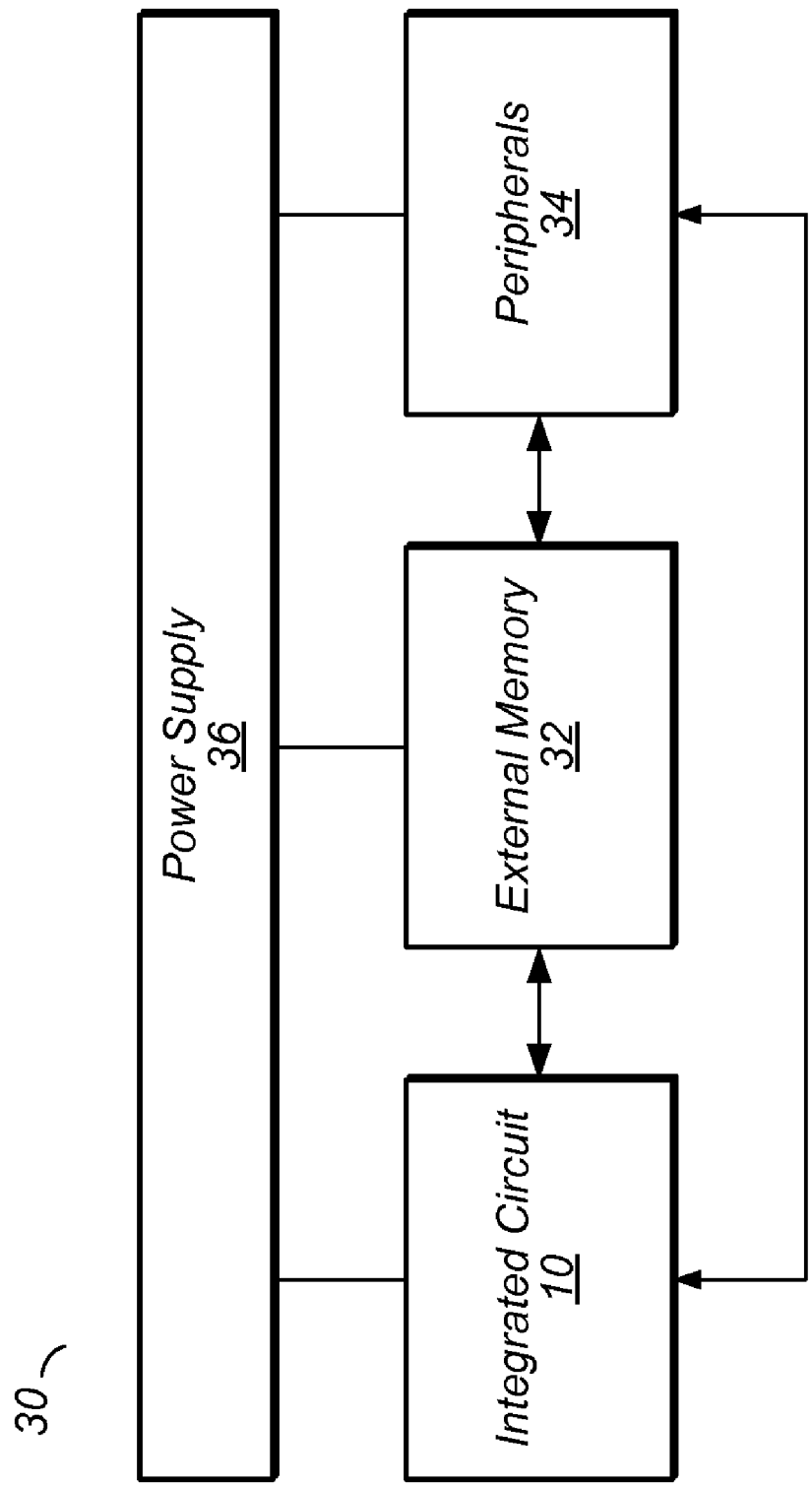
FIG. 3 is a block diagram of one embodiment of a computer system.

Turning next to FIG. 3, a block diagram of one embodiment of a system 30 is shown. In the illustrated embodiment, the system 30 includes at least one instance of an integrated circuit 10 coupled to one or more peripherals 34 and an external memory 32. A power supply 36 is also provided which supplies the supply voltages to the integrated circuit 38 as well as one or more supply voltages to the memory 32 and/or the peripherals 34. In some embodiments, more than one instance of the integrated circuit 38 may be included.

The external memory 32 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 34 may include peripheral 18 shown in FIG. 1, and may include any desired circuitry, depending on the type of system 30. For example, in one embodiment, the system 30 may be a mobile device and the peripherals 34 may include devices for various types of wireless communication, such as wifi, Bluetooth, cellular, global position system, etc. The peripherals 34 may also include additional storage, including RAM storage, solid-state storage, or disk storage. The peripherals 34 may include user interface devices such as a display screen, including touch display screens or multi-touch display screens, keyboard or other keys, microphones, speakers, etc.

Figure 4:
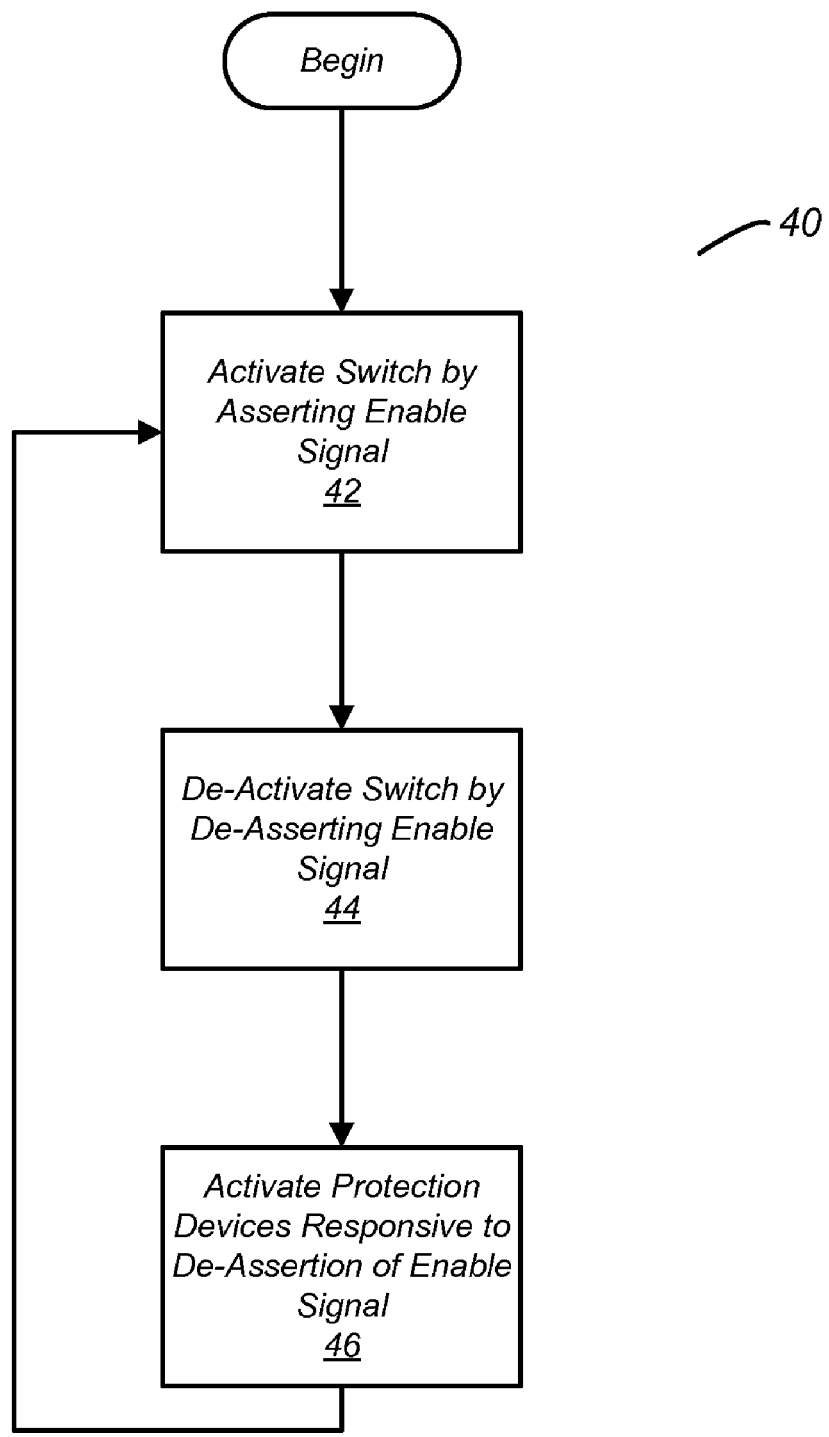
FIG. 4 is a block diagram of one embodiment of a method for operating a switch circuit.

Turning now to FIG. 4, a flow diagram of one embodiment of a method for operating a switch circuit is shown. In the embodiment shown, method 40 includes activation of a switch circuit by asserting an enable signal (block 42). Using switch circuit 20 as an example, activation thereof may be accomplished by asserting the Enable_H signal at a logic high voltage. The logic high voltage may be received on the gate terminals of transistors Q2, Q3, and Q6. Transistor Q2 is an NMOS transistor in the embodiment shown in FIG. 2, and thus activates responsive to the assertion of the Enable_H signal. Transistors Q3 and Q6, which are PMOS transistors that function as protection devices in the embodiment shown in FIG. 2, are deactivated responsive to the assertion of the Enable_H signal. Transistor Q5 is also a PMOS transistor in the embodiment of FIG. 2, and is coupled to receive the signal Enable_L, which is a complement of the Enable_H signal. Thus, when Enable_H transitions high, Enable_L may fall low, and transistor Q5 may thus activate responsive to the low on its gate terminal. Thus, when transistors Q2 and Q5 are both active, two separate signal paths may be provided between second data node 24 and first data node 21.

Deactivation of switch circuit 20 may be performed by de-asserting the enable signal (block 44). When Enable_H is de-asserted, it may fall low, while its complement, Enable_L, may transition high. Accordingly, transistors Q2 and Q5 may both become inactive, thereby blocking the signal paths between second data node 24 and first data node 22.

Protection devices Q3 and Q6 may also be activated in switch circuit 20, responsive to the de-assertion of the enable signal (block 46). When the Enable_H signal falls low, the low may be received on the gate terminals of protection devices Q3 and Q6. These devices may then be activated. Transistor Q3, when active, may provide a source-drain path between intermediate node 22 and the nominally fixed voltage (e.g., 1.8 volts in the embodiment of FIG. 2). Transistor Q6 may similarly provide a source-drain path between intermediate node 23 and the nominally fixed voltage. When transistors Q3 and Q6 are active, intermediate nodes 22 and 23 may be pulled up toward the nominally fixed voltage. This may ensure, for example, that a voltage difference between data node 21 and either of intermediate nodes 22 and 23 does not exceed the rated operating voltage range for transistors Q1 and Q4. Thus, for example, if transistors Q1 and Q4 are rated for operation in a range of 0-1.8 volts, a voltage of 3.6 volts on data node 21 may not damage these transistors, since intermediate nodes 22 and 23 may be pulled up to a voltage of 1.8 volts (through Q3 and Q6, respectively). Thus, the voltage difference between data node 21 and either of intermediate nodes 22 and 23 may be 1.8 volts, which does not exceed the operating voltage range of transistors Q1 and Q4 in this example.

Numerous variations and modifications will become apparent to those skilled in the art once the above disclosure is fully appreciated. It is intended that the following claims be interpreted to embrace all such variations and modifications.

What is claimed is:
1. A switch circuit comprising:
 a first transistor and a second transistor coupled in a cascode configuration, wherein a gate terminal of the first transistor is coupled to receive a constant fixed voltage during operation, and wherein a gate terminal of the second transistor is coupled to receive an enable signal, wherein the second transistor is configured to activate responsive to assertion of the enable signal; and
 a third transistor having a source to drain path coupled between the gate terminal of the first transistor and a first intermediate node between the first and second transistors, and a gate terminal coupled to receive the enable signal, wherein the third transistor is configured to activate responsive to a de-assertion of the enable signal.

2. The switch circuit as recited in claim 1, wherein the switch circuit further includes:
a fourth transistor and a fifth transistor coupled in a cascode configuration, wherein a gate terminal of the fourth transistor is coupled to receive the constant fixed voltage during operation, and wherein a gate terminal of the fifth transistor is coupled to receive the enable signal, wherein the second transistor is configured to activate responsive to assertion of the enable signal; and
a sixth transistor having a source to drain path coupled between the gate terminal of the fourth transistor and a second intermediate node between the fourth and fifth transistors, and a gate terminal coupled to receive the enable signal, wherein the sixth transistor is configured to activate responsive to a de-assertion of the enable signal.

3. The switch circuit as recited in claim 2, wherein the first transistor is coupled between the first intermediate node and a first data node, wherein the fourth transistor is coupled between the second intermediate node and the first data node, and wherein the constant fixed voltage is less than a full swing voltage of the first data node.

4. The switch circuit as recited in claim 3, wherein each of the transistors of the circuit are rated for operation in a voltage range that is less than the full swing voltage of the first data node.

5. The switch circuit as recited in claim 2, wherein the second transistor is coupled between the first intermediate node and a second data node, and wherein the fifth transistor is coupled between the second intermediate node and the second data node.

6. A circuit comprising:
a first transistor, wherein a gate terminal of the first transistor is coupled to receive a constant fixed voltage throughout operation, wherein the constant fixed voltage is less than a logic high voltage and greater than a logic low voltage for a signal input of the circuit, and wherein first and second terminals of the first transistor are coupled to a first data node and a first intermediate node, respectively;
a second transistor, wherein a gate terminal of the second transistor is coupled to receive an enable signal, and wherein first and second terminals of the second transistor are coupled to the first intermediate node and a second data node, respectively, and wherein the second transistor is configured to activate responsive to assertion of the enable signal; and
a third transistor, wherein a gate terminal of the third transistor is coupled to receive the enable signal, and wherein first and second terminals of the third transistor are coupled between the gate terminal of the first transistor and the first intermediate node, respectively, and wherein the third transistor is configured to activate responsive to de-asserting the enable signal.

7. The circuit as recited in claim 6, wherein the circuit further includes:
a fourth transistor, wherein a gate terminal of the further transistor is coupled to receive the constant fixed voltage during operation, and wherein first and second terminals of the further transistor are coupled to a first data node and a second intermediate node, respectively;
a fifth transistor, wherein a gate terminal of the fifth transistor is coupled to receive an enable signal, and wherein first and second terminals of the fifth transistor are coupled to the second intermediate node and the second data node, respectively, and wherein the fifth transistor is configured to activate responsive to assertion of the enable signal;
a sixth transistor, wherein a gate terminal of the sixth transistor is coupled to receive the enable signal, and wherein first and second terminals of the sixth transistor are coupled between the gate terminal of the fourth transistor and the second intermediate node, respectively, and wherein the sixth transistor is configured to activate responsive to de-asserting the enable signal.

8. The circuit as recited in claim 7, wherein a full swing voltage of a signal on the first data node is greater than the constant fixed voltage.

9. The circuit as recited in claim 8, wherein each of the transistors are rated for operation in a voltage range that is less than the full swing voltage.

10. The circuit as recited in claim 6, wherein the circuit includes a driver coupled to drive a signal onto the second data node and a receiver coupled to receive a signal via the second data node.

11. An integrated circuit (IC) comprising:
a serial bus port configured to couple the IC to a serial bus, wherein the serial bus is configured to convey a differential signal via a true signal path and a complementary signal path;
a first switch circuit coupled to the true signal path; and
a second switch circuit coupled to the complementary path, wherein each of the first and second switch circuits include:
a first transistor and a second transistor coupled in a cascode configuration, wherein a gate terminal of the first transistor is coupled to receive a constant fixed voltage throughout operation, and wherein a gate terminal of the second transistor is coupled to receive an enable signal, wherein the second transistor is configured to activate responsive to assertion of the enable signal; and
a third transistor having a source to drain path coupled between the gate terminal of the first transistor and a first intermediate node between the first and second transistors, and a gate terminal coupled to receive the enable signal, wherein the third transistor is configured to activate responsive to a de-assertion of the enable signal
wherein the constant fixed voltage varies only in response to noise sources during use.

12. The integrated circuit as recited in claim 11, further comprising:
a first driver coupled to drive a true output signal to the first switch circuit;
a first receiver coupled to receive a true input signal from the first switch circuit;
a second driver coupled to drive a complementary output signal to the second switch circuit; and
a second receiver coupled to receive a complementary input signal from the second switch circuit.

13. The integrated circuit as recited in claim 11, wherein each of the first and second switch circuits further include:
a fourth transistor and a fifth transistor coupled in a cascode configuration, wherein a gate terminal of the fourth transistor is coupled to receive the constant fixed voltage during operation, and wherein a gate terminal of the fifth transistor is coupled to receive the enable signal, wherein the second transistor is configured to activate responsive to assertion of the enable signal; and
a sixth transistor having a source to drain path coupled between the gate terminal of the fourth transistor and a second intermediate node between the fourth and fifth transistors, and a gate terminal coupled to receive the enable signal, wherein the sixth transistor is configured to activate responsive to a de-assertion of the enable signal.

14. The integrated circuit as recited in claim 13, wherein each of the first, second, third, fourth, fifth, and sixth transistors are configured to operate within a first range of voltages, wherein the serial bus is configured to convey signals within a second range of voltages, and wherein the second range has a greater magnitude than the first range.

15. The integrated circuit as recited in claim 14, wherein the magnitude of the second range is greater than a magnitude of the constant fixed voltage.

\* \* \* \* \*